United States Patent
Feiweier (10) Patent No.: US 9,465,094 B2
(45) Date of Patent: Oct. 11, 2016

(54) METHOD AND MAGNETIC RESONANCE DEVICE FOR THE AUTOMATED CLASSIFICATION OF AN IMAGE PROPERTY OF A MAGNETIC RESONANCE IMAGE

(71) Applicant: SIEMENS AKTIENGESELLSCHAFT, Munich (DE)

(72) Inventor: Thorsten Feiweier, Poxdorf (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 11 days.

(21) Appl. No.: 14/065,566

(22) Filed: Oct. 29, 2013

(65) Prior Publication Data
US 2014/0133725 A1    May 15, 2014

(30) Foreign Application Priority Data
Nov. 9, 2012   (DE) .................. 10 2012 220 449

(51) Int. Cl.
| G06K 9/00 | (2006.01) |
| G01R 33/56 | (2006.01) |
| G01R 33/50 | (2006.01) |

(52) U.S. Cl.
CPC ........... *G01R 33/5608* (2013.01); *G01R 33/50* (2013.01); *G01R 33/5602* (2013.01)

(58) Field of Classification Search
None
See application file for complete search history.

(56) References Cited

U.S. PATENT DOCUMENTS

| 4,962,763 A | 10/1990 | Sato |
| 2007/0123773 A1 | 5/2007 | Fuchs |
| 2009/0033328 A1 | 2/2009 | Feiweier |
| 2009/0105582 A1* | 4/2009 | Dougherty et al. ........... 600/420 |
| 2009/0185767 A1 | 7/2009 | Nollenberger et al. |
| 2010/0195883 A1* | 8/2010 | Patriarche et al. ........... 382/131 |
| 2012/0083687 A1* | 4/2012 | Parker et al. .................. 600/419 |
| 2013/0338930 A1* | 12/2013 | Senegas et al. ................. 702/19 |

FOREIGN PATENT DOCUMENTS

| CN | 101081951 A | 10/2007 |
| CN | 101359040 A | 2/2009 |

(Continued)

OTHER PUBLICATIONS

Scheffler Klaus, "A Pictorial Description of Steady-States in Rapid Magnetic Resonance Imaging", in: Magnetic Resonance, vol. 11; Issue 5, 1999, pp. 291-304.

(Continued)

*Primary Examiner* — Weiwen Yang
(74) *Attorney, Agent, or Firm* — Harness, Dickey & Pierce, P.L.C.

(57) ABSTRACT

A method is disclosed for the automated classification of an image property of a magnetic resonance image. In an embodiment, the method includes determining at least the parameters T, T2 and proton density of at least two tissues imaged in the magnetic resonance image or prespecifying at least two sets of at least these parameters; calculating the signal intensity in the center of the k-space for each imaged tissue or each set of parameters; and classifying the image property as a function of the calculated signal intensities. A magnetic resonance device is also disclosed.

16 Claims, 4 Drawing Sheets

(56) References Cited

FOREIGN PATENT DOCUMENTS

| DE | 102007036564 A1 | 2/2009 |
|---|---|---|
| EP | 0759562 A2 | 2/1997 |
| WO | WO 2011104605 A2 | 9/2011 |

OTHER PUBLICATIONS

Benoit-Cattin et al., "Numerical implementation of the bloch equations to simulate magnetization dynamics and imaging", pp. 1-9.

Lin et al., "Measurements of T1 Relaxation times at 3.0T: Implications for clinical MRA", in: Proc. Intl. Soc. Mag. Reson. Med; vol. 9, 2001, p. 1391.

Lu et al., "Routine Clinical Brain MRI Sequences for Use at 3.0 Tesla", in: Journal of Magnetic Resonance Imaging, vol. 22, 2005, pp. 13-22.

Shimizu et al., "Analysis of Tissue Contrast in CE-FLAIR Images by Computer Simulation Map", in: Proc. Intl. Soc. Mag. Reson. Med, vol. 9, 2001, p. 1364.

Chinese Office Action and English translation thereof dated Jan. 11, 2016.

Korean Office Action dated Aug. 10, 2016.

\* cited by examiner

METHOD AND MAGNETIC RESONANCE DEVICE FOR THE AUTOMATED CLASSIFICATION OF AN IMAGE PROPERTY OF A MAGNETIC RESONANCE IMAGE

PRIORITY STATEMENT

The present application hereby claims priority under 35 U.S.C. §119 to German patent application numbers DE 102012220449.0 filed Nov. 9, 2012, the entire contents of which are hereby incorporated herein by reference.

FIELD

At least one embodiment of the present invention generally relates to a method and/or a magnetic resonance device for the automated classification of an image property of a magnetic resonance image.

BACKGROUND

Magnetic resonance imaging has developed into a standard method in medical diagnosis since the invention of rapid imaging. A plurality of recording methods exists, which differ inter alia in terms of the required measuring time and the resulting image contrasts. Methods for recording so-called spin density or proton density-weighted, T1-, T2- or T2*-weighted images exist, furthermore, diffusion imaging is also known.

If the term recording of images, is used below this naturally means that, as conventional in magnetic resonance tomography, a slice of the examination object located in the magnetic resonance tomography system is excited by way of an excitation pulse and a slice selection gradient, the signal of the excited spin is read out with a detection coil and is transmitted via a number of electronic processing steps, for instance an AD converter, to a storage facility, and the stored raw data is again converted into one or a number of image data records or images by means of a number of post processing steps, also known as post processing. However it is in line with conventional linguistic usage to refer to the recording of images, as a result of which this wording is also used in the present application.

Other image recording techniques, such as for instance non-selective 3D imaging, which operates without slice selection gradient, can naturally also be used.

The raw data is usually recorded in rows in the so-called k-space, thereby resulting in the following:

As already described, at least one detection coil is used to record the signal. This coil is only able to forward the induced voltage. Therefore only a temporally varying voltage signal is obtained. In order to be able to obtain an item of position information from a signal of this type, magnetic field gradients are used, in order to vary the resonance frequency of the signal in a position-dependent manner and thus to obtain an item of position information. For position encoding in a spatial direction, a magnetic field gradient, the so-called read-out or read gradient, can be connected during the reading out of the signal. In order to encode the signal in further spatial directions, so-called phase gradients are used. The signals which are recorded with a specific value of the phase gradient form a line in the k-space. Depending on the resolution in the spatial direction encoded by the phase gradients, the phase gradient is connected at different strengths. The line at which the phase gradient has the value 0 forms the center of the k-space.

Two phase encoding gradients or with 3D recording methods also three phase gradients can however also be used. The use of more complex recording schemes, such as for instance spiral or radial imaging with special k-space trajectories, is likewise also possible. The center of the k-space is the respective point at which all phase gradients have their minimal value.

Since, apart from the value of the phase gradient, the sequence of HF pulses and magnetic field gradients always repeats at least in the basic sequences, these can be shown in a sequence diagram, in which only one cycle between the excitation of the spin and the read-out of the signal and if necessary preparation modules used are shown.

The gradient echo sequence (GE), the spin echo sequence (SE), the turbo spin echo sequence (TSE) and also the true fisp sequence are inter alia regarded as basic sequences.

Imaging sequences derived herefrom are for instance the Short Inversion Recovery (STIR) sequence or the Fluid Attended Inversion Recovery (FLAIR) sequence. These are based on the SE sequence in that prior to the 90° excitation pulse of the SE sequence, a 180° pulse, also known as inversion pulse, is switched. The time between the 180° inversion pulse and the 90° excitation pulse is the inversion time TI. The difference between the STIR sequence and the FLAIR sequence only lies in the inversion time TI, which lies in the range of hundreds of milliseconds in the case of the STIR sequence and at two seconds in the case of the FLAIR sequence. Furthermore, a plurality of further variations in standard sequences exist, for instance for flux compensation.

On account of the plurality of possibilities, it is not possible, with the aid of individual setting values such as echo time TE or repetition time TR, to predict the resulting contrast behavior of the magnetic resonance image. Contrast behavior is understood to mean the signal intensity difference of the various tissues imaged in the magnetic resonance image, caused by the different relaxation behaviors and proton densities. The contrast behavior is often also abbreviated to contrast, but the term "contrast" may basically have an additional connotation. In the present application, the contrast behavior is meant with the use of the term 'contrast'.

An assignment or knowledge of the contrast behavior of magnetic resonance images is however desirable in order automatically to display to a user, using a display facility, in an optimized arrangement adjusted in particular to a medical question, the images with different contrasts.

SUMMARY

A method and a magnetic resonance device are disclosed which enable an automatic classification of a property of a magnetic resonance image irrespective of the underlying image recording method and the setting values thereof.

A method for classifying an image property of a magnetic resonance image is disclosed. Advantageous developments of the invention are the subject matter of dependent claims.

A method for the automated classification of an image property of a magnetic resonance image is disclosed. In an embodiment, the method comprises determining at least the parameters and proton density of at least two tissues imaged in the magnetic resonance image or prespecifying at least two sets of at least these parameters, calculating the signal intensity in the center of the k-space for each imaged tissue or each set of parameters, and classifying the image property as a function of the calculated signal intensities.

An embodiment is also directed to a magnetic resonance device. This, in addition to a control unit and a memory, also includes a simulation unit and a classification unit. The simulation unit and the classification unit can preferably be embodied as a computer program product. The simulation unit reads in the parameters of the tissue and at least one part of the setting values of the imaging recording method used to record the magnetic resonance image as input values and automatically determines the required signal intensities therefrom. The classification unit uses the calculated intensities in order to determine the class therefrom.

Embodiments of the afore-cited method can be implemented in the control apparatus here as software or however also as (hard-wired) hardware.

BRIEF DESCRIPTION OF THE DRAWINGS

Further advantages, features and details of the present invention result from the subsequent description of advantageous embodiments of the invention.
in which.

DETAILED DESCRIPTION OF THE EXAMPLE EMBODIMENTS

The present invention will be further described in detail in conjunction with the accompanying drawings and embodiments. It should be understood that the particular embodiments described herein are only used to illustrate the present invention but not to limit the present invention.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

Specific structural and functional details disclosed herein are merely representative for purposes of describing example embodiments of the present invention. This invention may, however, be embodied in many alternate forms and should not be construed as limited to only the embodiments set forth herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

According to an embodiment of the invention, the parameters T1, T2 and proton densities (PD) of at least two tissues imaged in the magnetic resonance image are determined as a function of the field strength of the basic magnetic field (B0) of the magnetic resonance device. Aside from the cited parameters, other parameters such as T2*, the diffusion coefficient (ADC) or also flux speeds can also be taken into account.

Various possibilities are available for determining the cited parameters. On the one hand, the parameters can be taken from publications and stored. Depending on the field strength, the resulting values of the parameters T1, T2 and PD fluctuate. The algorithm used for evaluation purposes as well as the device properties of the magnetic resonance tomography system can also have an influence on the resulting value of a parameter. A set of parameters can therefore alternatively be determined for each tissue, by test subjects being measured with the sequences used on the respective magnetic resonance tomography system. In a further embodiment, all or at least one part of the parameter values can be measured directly on a test subject. If a T1 card is produced of a test subject and/or patient for instance of the examination area, the T1 values of the tissue shown in the T1 card can be determined and used. The proton density is also normally based on the raw data required to produce a T1 card. The still absent values for T2 can be obtained so as to reduce the overall measurement time as already described above from stored values. Another method can therefore be used for determining each parameter.

Instead of using physiologically appropriate parameters, a number of artificially generated parameters can also be used. For instance, a table with N*M*K entries can be produced, in which all permutations of N T1 values, MT2 values and K PD values are listed. The respective values are nevertheless to extend beyond a physiological meaningful range. The T1 values extend for instance from 100 ms to 5000 ms, T2 goes from 10 ms to 5000 ms and PD from 0.1-1.0.

In the next step, the signal intensity of the transversal magnetization is calculated in the center of the k-space for each tissue and/or each set of parameters. This is therefore a simulation, which is performed with the aid of the measured or otherwise predetermined parameters. Reference is made at this point to the fact that tissue-dependent variables are referred to as parameters in the present application, while variables to be set on the magnetic resonance tomography system such as the repetition time of an image recording method are referred to as setting values. DE 10 2007 036 554 B4, the entire contents of which are hereby incorporated herein by reference, is based on a method for simulating a magnetic resonance image, which is used to optimize the protocol parameters and/or setting values. This method can also be modified so as to determine signal intensities in the center of the k-space.

Here the use of the artificially generated parameters is advantageous in that they only have to be configured once and in a field strength-independent manner. At least three values are advantageously used for each parameter, namely from the lower value range, from the average and from the upper value range. With the afore-cited values, the values 100 ms, 2 s and 5 s can be used for T1, the values 10 ms, 1 s and 5 s for T2 and 0.1, 0.5 and 1.0 for PD as well as any further intermediate values. Some can be eliminated from the thus resulting 3×3×3=27 simulation value triples, by it being noted that in biological test subjects T1 is greater than T2. The minimum rate consists of two value triples, in which the lowest and the highest values are used in each instance, in other words 100 ms, 10 ms and 0.1 and as a second value triple 5 s, 5 s and 1.0.

The artificially generated parameters allow a statement to be made about the contrast behavior of a magnetic resonance image, because it can be assumed that with examinations on living subjects, the physiologically meaningful area is normally approximately covered. On the other hand, the recorded images would also be low in contrast, which is known not to be the case.

In one development, when selecting the artificially generated parameters, the recording area, for instance head, lungs or abdomen, can be taken into account. It is as a result possible to rule out that so-to-speak the incorrect contrast of two possible contrasts is inadvertently selected. As already described, a magnetic resonance image always has a mixture of contrasts, of which one is significantly in the foreground. For instance, a minimal T2 or T2* contrast is always present, since the echo time is always greater than zero. If the T2 values of the recorded tissue are in a very narrow area and both a T1, and also a T2 weighting result in respect of the setting values of the sequence and the simulation based thereupon, it can be taken into account during the classification that a T2 contrast cannot exist or can only exist to a minimal degree. This can be taken into account by restricting the artificially generated parameters to physiologically meaningful values as a function of the examination area.

The image property is classified in the last step with the aid of the calculated signal intensities.

Within the scope of the simulation of the signal intensities, the setting values forming the basis of the recording of the magnetic resonance image are in particular made available. The setting values are usually stored within the scope of recording a magnetic resonance image, which is why they are always available. The temporal sequence and/or the distances of HF pulses, their flip angle, and the gradient torque applied between the HF pulses results from protocols stored on the magnetic resonance device. The sequence of variables with which a magnetic resonance image was recorded can therefore be precisely verified, the details of the sequence course are known.

The contrast behavior of the magnetic resonance image can particularly advantageously be classified as an image property.

An embodiment of the inventive method is particularly advantageous in the afore-cited basic sequences or their modifications, in which no preparation module is used, with which the contrast behavior is clearly defined. The presence of a flux preparation module defines a flux contrast for instance. It is precisely the afore-cited examples of the STIR and FLAIR sequences that indicate that a single setting value can effect an entirely different contrast behavior. In addition, the definition of the contrast behavior of a magnetic resonance image is hampered in that a T1 and a T2 or T2* weighting basically exists in each image. With very long repetition times, the T1 weighting is nevertheless barely visible, it is however present. In addition, the question of contrast behavior also depends on the imaged tissue and/or its parameters. A T1 weighting can namely only be achieved if at least one tissue has a diverging T1 time. This applies similarly to the other parameters. This requirement is usually fulfilled with patients.

An optimal classification of the contrast behavior is therefore achieved with the use of an embodiment of the inventive method.

The contrast behavior can preferably be arranged in one of the classes T1, T2, T2*, diffusion, perfusion, FMRI, proton density or FLAIR. The perfusion contrast can be generated for instance by way of arterial spin labeling (ASL). FLAIR contrast behavior is a contrast behavior in which a stationary fluid signal is suppressed. A distinction is made here between the water suppression, which is used in spectroscopic sequences and with which the entire water signal is suppressed.

It should generally be stated that each of the cited contrasts can be obtained with a plurality of different imaging sequences. Reference is made purely by way of example hereto in that a T1 contrast behavior is obtained inter alia by 'short' repetition times TR. A gradient echo sequence, a spin echo sequence or also a turbo spin echo sequence comprise a T1 contrast, if the repetition time is selected as shorter than the longest T1 time present in a tissue but longer than or equal to the shortest T1 time present in a tissue.

It is therefore often not possible to conclude in a direct and fault-free fashion the resulting contrast behavior from the sequence used and/or the image recording method used. This is only achieved by the simulation of the contrast behavior.

The determined class can advantageously be automatically entered in a DICOM data record in the field 'Flavor'. DICOM is a standard for exchanging image data. In addition to the image data, additional information is stored here in standard form. This makes it possible to explicitly select magnetic resonance images with the same contrast behavior and to simultaneously display the same to a user. A physician can thus easily and efficiently indicate a number of perfusion data records for instance in order to be able to use already recorded magnetic resonance images, with which a finding is already carried out, as a comparison with a current examination. Without automatic classification of the contrast behavior, the physician has to look through the data records either according to specific sequence names or the names of patients, for which corresponding magnetic resonance images were recorded.

Advantageously the signal intensities can be calculated with the aid of the Bloch equations. These are movement equations for describing the resonance effect in the nuclear spin tomography. By using Block equations, it is possible to calculate the signal intensity in complicated sequences of excitation and refocusing pulses, without an analytical solution having to be calculated for the signal behavior of the sequence. The precise sequence of HF pulses and magnetic field gradients is known as already described above, therefore a good approximation can be determined with the Bloch equations.

The setting values, in particular the setting values of the HF pulses and/or the magnetic field gradients, of at least one part of the imaging method used to record the raw data of the magnetic resonance image can preferably used to calculate the signal intensities. It is therefore not necessary to simulate the entire course of an imaging method, it is instead sufficient to reproduce a section thereof. This section can be the sequence of HF pulses and magnetic field gradients between a, in particular the first, excitation pulse and the reading-out of the signals of the spin excited by this excitation pulse. This is the section which is usually shown in a sequence diagram. One or a number of preparation modules connected in particular upstream of the basic sequence, for instance a diffusion module, a fat suppression module or an inversion module, can also be taken into account.

The waiting time between two sequence sections is however usually not long enough for the longitudinal magnetization to completely relax. The part of the imaging sequence taken into account must therefore generally contain at least two sequences of HF pulses and magnetic field gradients between signal preparation, excitation, signal evolution and read-out. In other words, the section imaged in a sequence diagram is passed though at least twice.

Alternatively, repeating sections of the imaging sequence can at least partly be taken into consideration repeatedly during the calculation. This is particularly relevant in sequences in which a so-called "steady state" occurs. This thus means that the excited initial magnetization initially reduces from excitation to excitation until the "steady state" is achieved. A constant initial magnetization is thus always available. In this way, the setting behavior of the signal and/or of the longitudinal magnetization described in the last paragraph can basically also be taken into consideration as the achievement of a "steady state". With this approach, a spinecho sequence also comprises a "steady state" during normal k-space line scan, which is achieved for instance in the second k-space line, depending on the repetition and relaxation times, but also in the first or a subsequent k-space line.

Whether or not a "steady state" is to be taken into account or not also does depends on the recording scheme. The recording scheme specifies the recording sequence of the k-space lines. It is possible for instance to record the central k-space lines right at the start of a measurement. Alternatively, it is however also possible to scan the k-space line by line, wherein the center of the k-space is acquired in the middle of the measurement. If as is fairly common 128 or 256 k-space lines are recorded, a possible "steady state" is achieved in the half (64 or 128). During the simulation, not all steps have to be reproduced in order to achieve the k-space center. The calculation of the signal intensity can advantageously be terminated if the difference between the signal intensities of all tissues of two consecutive calculations does not reach a predetermined threshold value.

The simulation of the signal behavior or the signal intensities is thus terminated if the "steady state" is achieved. Since the "steady state" is achieved depending on the imaging sequence for instance after 20 or 30 excitation steps, the simulation time can be significantly shortened.

The recording scheme is however not only to be taken into account during sequences in which a "steady state" is achieved. For instance, a number of echos are acquired in a train during a turbo spin echo. Depending on the recording scheme, the echo which lies in the center of the k-space, is T2-weighted or also not. This can also be determined with the aid of so-called reordering tables.

The classification can preferably be determined by means of a correlation coefficient. Care should be taken to ensure that the Pearson correlation coefficient, which is equated with the term correlation coefficient, presupposes at least interval-scaled data and represents a measure of the linear relationship between two variables. The signal intensities of the tissue are negatively correlated here with the T1 times of the tissue. Tissues with a long T1 appear darker and are therefore hypo intense, whereas tissues with a short T1 appear light and are known as hyper intense.

A positive correlation conversely exists with the parameters T2 and proton density. The larger the T2 or proton density, the greater the corresponding signal intensity.

A corresponding contrast behavior of the magnetic resonance image is deemed to be available if the correlation coefficient exceeds or does not reach a predetermined correlation threshold value, for instance 0.5

The classification can alternatively be determined by way of an evaluation scheme. In this scheme the signal intensities of at least two tissues respectively are compared with one another and the association with a class is identified or negated as a function of the comparison. If the association with a class has been determined, the evaluation scheme can be interrupted.

An embodiment is also directed to a magnetic resonance device. This, in addition to a control unit and a memory, also includes a simulation unit and a classification unit. The simulation unit and the classification unit can preferably be embodied as a computer program product. The simulation unit reads in the parameters of the tissue and at least one part of the setting values of the imaging recording method used to record the magnetic resonance image as input values and automatically determines the required signal intensities therefrom. The classification unit uses the calculated intensities in order to determine the class therefrom.

Embodiments of the afore-cited method can be implemented in the control apparatus here as software or however also as (hard-wired) hardware.

The advantageous embodiments of the inventive method correspond to corresponding embodiments of the inventive magnetic resonance device. In order to prevent unnecessary repetitions, reference is thus made to the corresponding method features and their advantages.

According to at least one embodiment of the invention, a PET start image data record and an anatomy image data record are first recorded. In this situation, the term "recording of an image data record" is meant the recording, by a detector corresponding to one of the forms of imaging, of signals, also referred to as measurement data or raw data, storing them at least in a volatile memory, appropriate post-processing of the method, and then representing or storing them. Post-processing steps within the framework of magnetic resonance imaging are, for example, the sorting of the measurement data, the Fourier transformation of the measurement data or, respectively, of the sorted measurement data or what is referred to as zero-filling.

Figure 1:
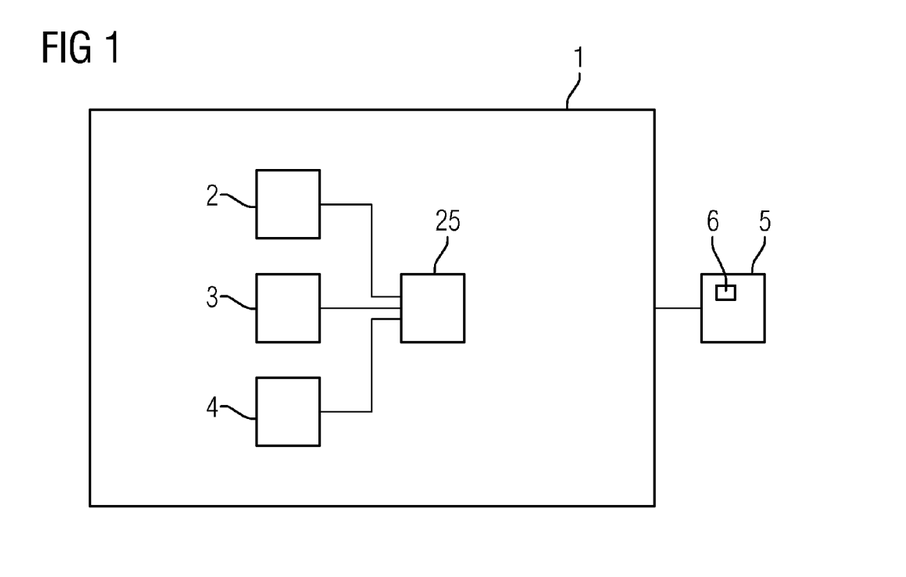
FIG. 1 shows an embodiment of an inventive magnetic resonance device.

FIG. 1 shows a schematic representation of an inventive magnetic resonance device 1. This is embodied as a magnetic resonance tomography system, thus particularly has the coils required to generate the magnetic field gradients. It includes a simulation unit 2, a classification unit 3 and a storage unit 4. A display unit 5 is provided to display the magnetic resonance image 6. Furthermore elements which are naturally present in a magnetic resonance tomography system such as the coils to generate the main magnetic field B0, a patient couch, control and switching electronics etc. are not shown explicitly and are assumed to be known and available.

Figure 2:
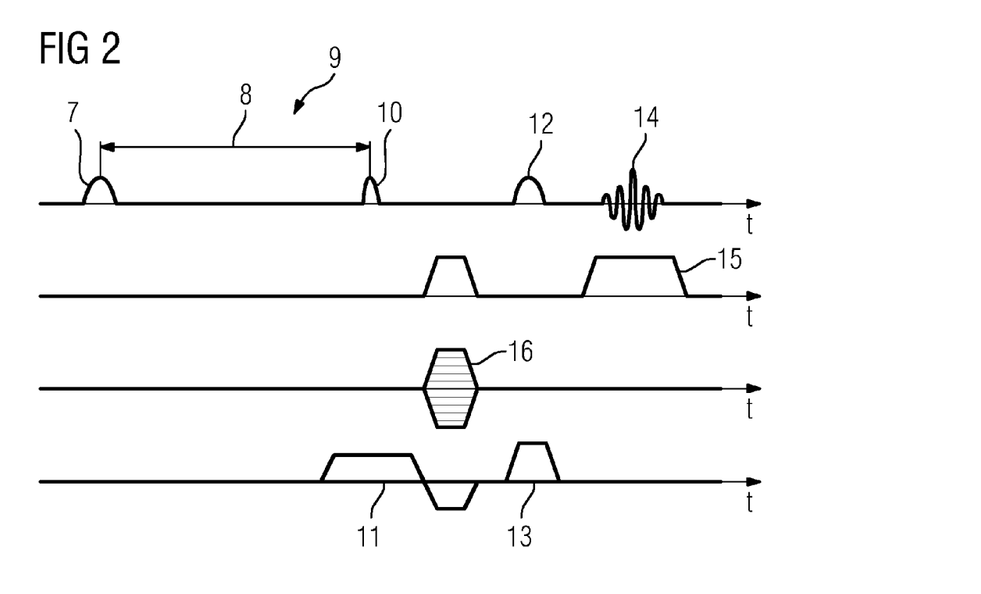
FIG. 2 shows a sequence diagram of a FLAIR image recording method.

FIG. 2 shows the sequence diagram of a FLAIR image recording sequence. A sequence of HF pulses and magnetic field gradients for recording a k-space line is shown as follows:

180° inversion pulse 7 is first irradiated. The inversion time 8 then follows. The 180° inversion pulse 7 and the inversion time 8 form an inversion module 9, which can be switched to form various imaging sequences. After the inversion time 8, a 90° pulse 10 is irradiated as an excitation pulse. During irradiation of the 90° pulse 10, the slice selection gradient 11 is switched. A further waiting time follows, after which the 180° refocusing pulse 12 with a further slice selection gradient 13 follows. The signal 14 is then read out during the presence of the read-out gradient 15. A further waiting time until completion of the repetition time then follows. The phase encoding gradient 16 can be used before or after the 180° refocusing pulse 12. If the inversion module 9 is omitted, an embodiment of a spin echo sequence is obtained.

A k-space line is recorded by a single pass of this sequence. In order to record a complete set of k-space lines, this sequence is repeated with diverging phase encoding gradients 16.

Figure 3:
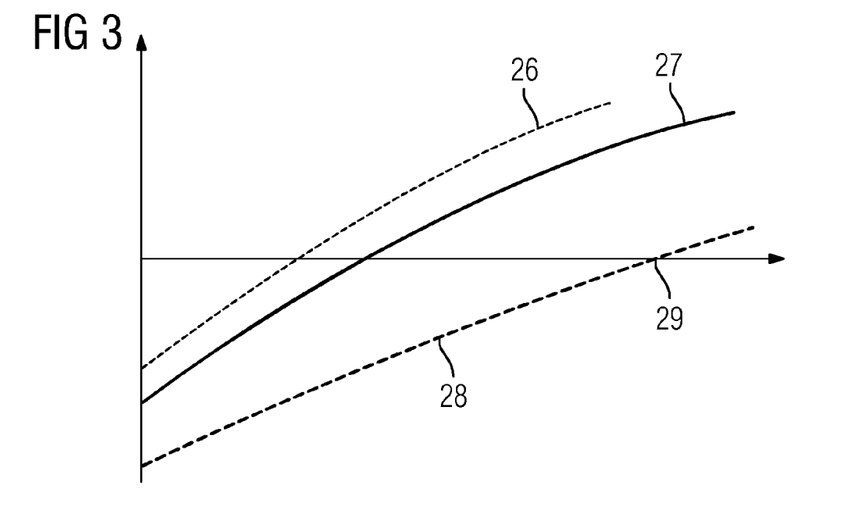
FIG. 3 shows the temporal curve of the longitudinal magnetization of a number of tissues

FIG. 3 shows the temporal curve of the longitudinal magnetization for three different tissues according to an inversion pulse 8. Purely by way of example, the temporal curve of white brain matter (WM) is shown with curve 26, grey brain matter (GM) with curve 27 and cerebral spinal fluid (CSF) with curve 28. As apparent from the table shown below, the T1 time of the cerebral spinal fluid is considerably slower than with white or grey brain matter. As a result, the zero crossing 29 of the longitudinal magnetization of cerebral spinal fluid lies at a point in time at which the longitudinal magnetization of white or grey brain matter is almost completely relaxed. If the inversion time 9 is selected such that the 90° pulse 10 is irradiated during the zero crossing 29 of the longitudinal magnetization of the cerebral spinal fluid, the cerebral spinal fluid emits no signal. A suppression of the signal of the cerebral spinal fluid is achieved as a result.

If the inversion time 9 is selected to be shorter, the resulting contrast behavior cannot be clearly read out from the setting values. Without analyzing the resulting magnetic resonance image, it is therefore not possible to specify the contrast behavior. It is possible with an embodiment of the inventive method to simulate the signal behavior and as a result to reliably define the contrast behavior.

Figure 4:
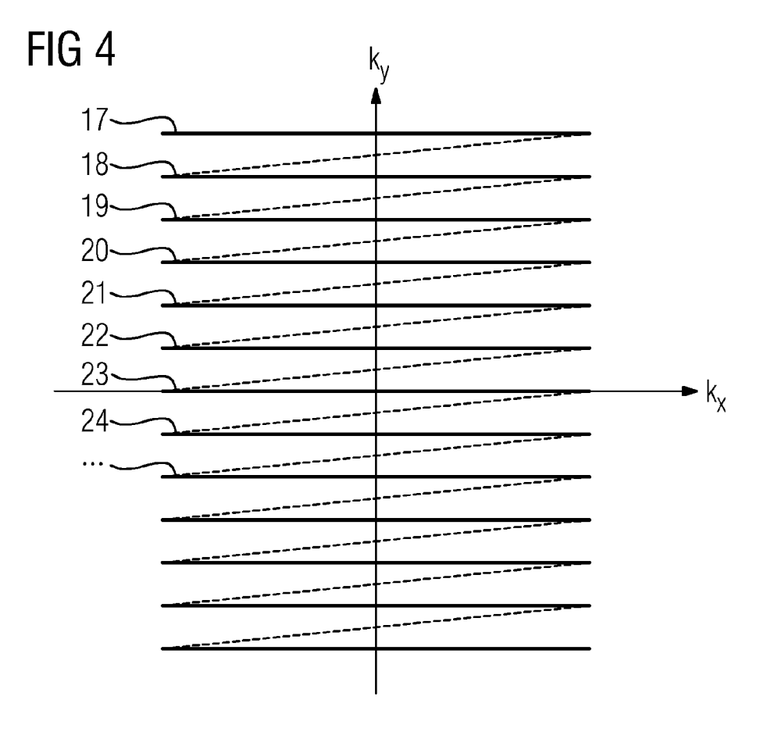
FIG. 4 shows a recording scheme in a first embodiment.

FIG. 4 shows a recording scheme in a first embodiment. Here the k-space lines are recorded one after the other. In order to realize this scanning scheme, the sequence shown in FIG. 2 is repeatedly recorded, wherein the phase encoding gradient 16 is switched from a minimal value –Gy ever increasingly to a maximum value +Gy. The k-space line 17 is first recorded, then the k-space line 18 and then the k-space line 19 etc. A higher numerical value of the reference numeral herewith indicates a later recording of the k-space line. The center of the k-space (ky=0) nevertheless lies in the center of the data recording, for simulation of the signal intensities of the tissue, it is generally sufficient to only simulate 2-10, e.g. two sequences. This is because on account of the repetition time to be selected after the first excitation and read-out cycle, an increasingly constant initial magnetization is present.

Despite an identical recording scheme, it behaves differently with a so-called FLASH imaging sequence. The "steady state" herewith forms on account of the short repetition time to be selected only after a plurality of repetitions. The corresponding sequence is therefore to be simulated repeatedly until the difference of the simulated signal intensities for each tissue does not reach a predetermined threshold value. Depending on the repetition time and read-out angle of the HF pulse, the simulation must typically be repeated 20 to 30 times, in some cases however also even more often. It is however not always necessary to implement the simulation of the signal intensities until actually reaching the k-space center, since the signal intensities often only diverge marginally beforehand.

A further method for recording a magnetic resonance image is the HASTE sequence. With this, the k-space is not fully scanned, all recorded k-space lines are however taken into consideration, wherein the signal is refocused with 180° pulses between the recording of the individual k-space lines. No "steady state" is herewith embodied, as a result of which the signal intensities do not diverge and the simulation to the center of the k-space is therefore to be continued.

Figure 5:
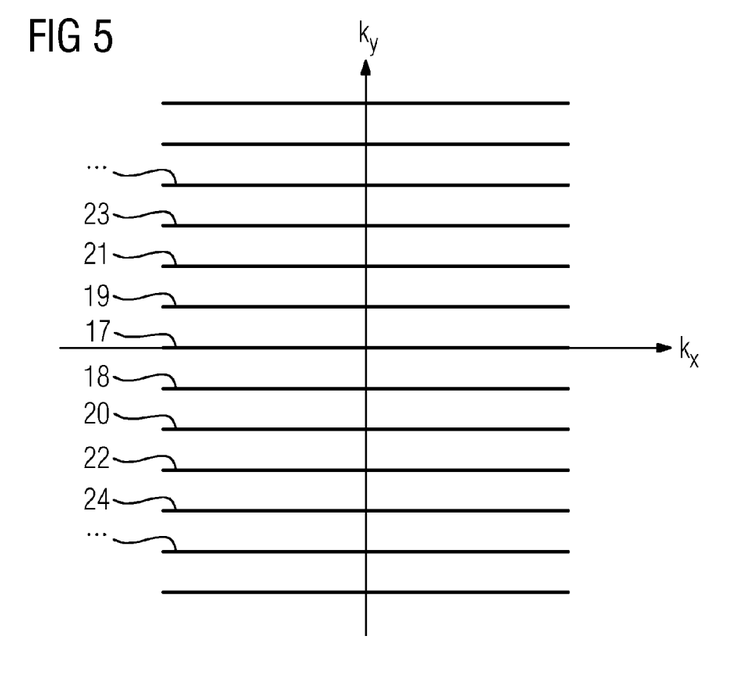
FIG. 5 shows a recording scheme in a second embodiment.

Contrary to the recording scheme shown in FIG. 4, only one repetition of the simulation is needed in the recording scheme shown in FIG. 5. In the recording scheme shown in FIG. 5, the k-space line 17 is firstly recorded in the center of the k-space. The further k-space lines 18, 19, 20, 21, 22, 23, 24 etc. are recorded in this sequence starting from the center and moving away therefrom. The contrast behavior of a magnetic resonance image 6 is mainly defined by the contrast behavior in the center of the k-space. It is therefore sufficient to simulate the signal intensities of the tissue in the center of the k-space.

Figure 6:
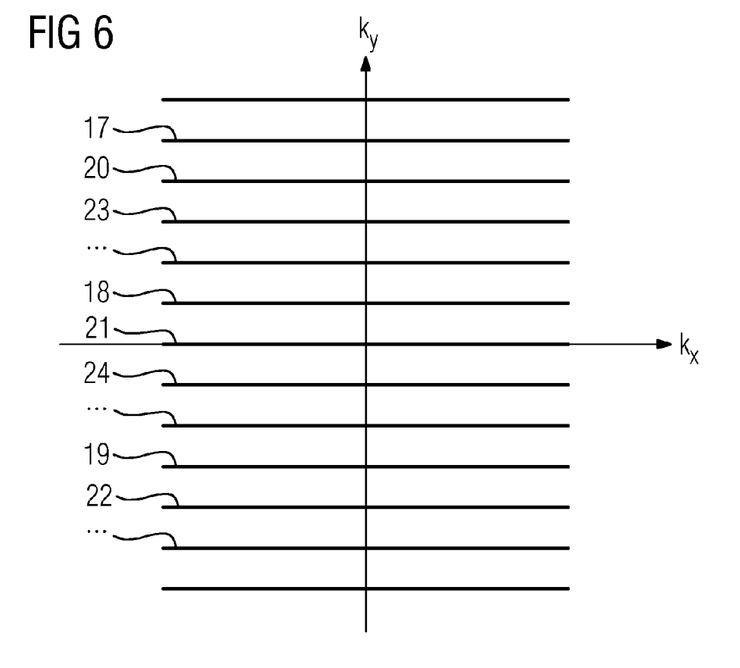
FIG. 6 shows a recording scheme in a third embodiment and,
FIG. 7 shows an evaluation scheme.

FIG. 6 shows a further embodiment of a recording scheme. This is used in particular in TSE sequences. A number of k-space lines are herewith acquired within an echo train. The position of the k-space lines (17, 20, 23) at the start of an echo train and the number of echos in the echo train determines which k-space line (21) lies in the center of the k-space. The simulation is to be repeated until that k-space line is achieved which lies in the center of the k-space. With a number of 4-8 echos in the echo train, this results in 1 to 8 repetitions. This number also conforms, as described, with the position of the k-space line (17, 20, 23) at the start of the echo train and can therefore not be determined in more detail in advance. If the number of the echo in the k-space center is known across a reordering table, the simulation during the convergence of the signal behavior can also be interrupted in advance.

Figure 7:
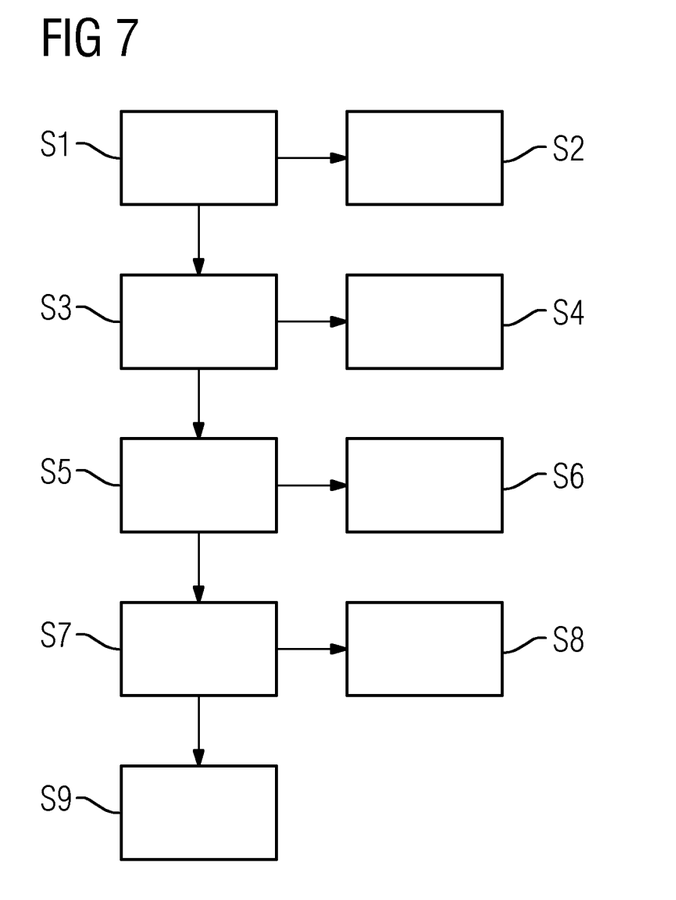

FIG. 7 shows an evaluation scheme for classifying the contrast behavior of a magnetic resonance image 6 with the aid of the simulated and/or calculated signal intensities of the tissue. Purely by way of example, reference is once again made to white brain matter (WM), grey brain matter (GM) and cerebral spinal fluid (CSF). For these 3 tissues, the relaxation times T1 and T2 are specified in milliseconds in table 1 and the proton density in random units and a simulation value (Ssimu) is likewise specified in random units. The simulation value was obtained for a spin echo sequence with an echo time of 20 ms and a repetition time of 0.4 s. The values from table 1 are literature values, which can be inferred for instance from Lin et al., Measurements of T1 Relaxation times at 3.0 T: Implications for clinical MRA, Proc. ISMRM 2001, p. 1391, the entire contents of which is incorporated herein by reference.

TABLE 1

|     | T1/ms | T2/ms | PD/a.u. | Ssimu |
| --- | --- | --- | --- | --- |
| GM  | 1000 | 95 | 0.75 | 0.20 |
| WM  | 590 | 85 | 0.65 | 0.25 |
| CSF | 4200 | 2000 | 1.0 | 0.09 |

The evaluation scheme according to FIG. 7 is described below. In this scheme, the simulated signal intensity of the cerebral spinal fluid is abbreviated to "CSF" for a simplified description, "GM" and "WM" are similarly used for grey and white brain matter.

As a first step S1, the condition "(CSF<0.1*WM) AND (CSF<0.1*GM)" is monitored. If the condition is true, it is stored in step S2 as class "FLAIR". This may take place in particular in the corresponding DICOM data record in the field "Flavour".

If the condition is not fulfilled, it is considered in step D3 as the next condition "(WM==GM) AND (WM==CSF)". The parity of the signal intensities is naturally never completely identical, as a result of which "(WM−GM<threshold value) AND (WM−CSF<threshold value)" are monitored synonymously. When one of these conditions is fulfilled, it is stored in step S4 as class "proton density".

On the other hand, the condition "(CSF>GM) UND (CSF>WM)" is monitored in step S5. Similarly to the previous procedure, when the condition is fulfilled in step S6, it is defined and stored as class "T2 ", on the other hand it is continued with step S7.

In step S7, "GM<WM" is tested as the condition. If this condition is fulfilled, it is stored as class "T1 " (step S8). If this is not fulfilled, it is stored in step S9 as class "not classifiable". It is then still always possible to perform the classification by visual examination by evaluating the magnetic resonance image 6.

If this evaluation scheme is applied to the simulation values shown in table 1, it is apparent that the conditions are not fulfilled in accordance with steps S1, S3 and S5. The condition according to step S7 is nevertheless true, as a result of which the magnetic resonance image 6 is arranged in the class "T1".

If the correlation coefficients between a parameter and the simulation values respectively are calculated for the values shown in table 1, the results listed in table 2 are obtained.

TABLE 2

|     | Ssimu - T1 | Ssimu - T2 | Ssimu - PD |
| --- | --- | --- | --- |
| correlation coefficient | −0.989 | −0.976 | −0.999 |

On account of the negative correlation to be expected between the simulated signal intensities and the respective T1 times, a very high (negative) correlation exists. In respect of T2 and the proton density, positive correlation values are nevertheless expected, as a result of which the correlation values also speak for the presence of a T1 contrast behavior.

In order to be able to increase the statistical significant, a larger number of tissue types, if necessary also the predetermined sets of parameters, can be used. A strong correlation is given from a threshold value of 0.5 for T2 and the proton density or below −0.5 for T1. Relative signal intensities of 0.1 are deemed to be heavily suppressed. In the example, the signal intensity of the cerebral spinal fluid (CSF) is nevertheless below 0.1 compared with its starting value, but not compared with white brain matter (WM) or grey brain matter (GM). The cerebral spinal fluid (CSF) is therefore not regarded as heavily suppressed.

When artificially generated parameters are used, classification of the contrast behavior is then achieved as follows:

N, in particular 5, T1 values, M, in particular 5, T2 values and K, in particular 5, PD values are generated. 125 different combinations of T1-T2-PD value pairs can be produced therefrom. The signal intensity S(n, m, k) is simulated for each of these value pairs. Three diagrams and/or value matrices can be determined herefrom, nevertheless in each instance S(n, m, k) to T1, T2 or PD. All simulated amplitudes are plot-ted in each diagram so that scatter plots are produced in an imaged representation. For each representation and/or value matrix, the correlation coefficient is determined and the contrast behavior is determined herefrom.

As already described, the selection of the value pairs is restricted to pairs in which T1 is larger than T2. Furthermore, a value range to be selected for each parameter, which is relevant in the examined body region, can be defined during generation.

In one embodiment, the value range to be selected is restricted to T1 and T2 values of less than is and fluids are thus ruled out. Its suppression, in other words the presence of a FLAIR contrast behavior, is then determined as described above.

What is claimed is:

1. A method for the automated classification of an image property of a magnetic resonance image, the method comprising:
   determining at least the parameters and proton density of at least two tissues imaged in the magnetic resonance image or prespecifying at least two sets of at least the parameters;
   calculating signal intensity in a center of a k-space for each imaged tissue or each set of parameters;
   determining a correlation coefficient between the signal intensities and the parameters and proton density; and
   classifying the image property based on the correlation coefficient, wherein a contrast behavior of the magnetic resonance image is classified as the image property and the contrast behavior is classified into one of the classes T1 dominant, T2 dominant, T2* dominant, diffusion dominant, perfusion dominant, FMRI dominant, proton density dominant or FLAIR dominant.

2. The method of claim 1, wherein the signal intensities are calculated with the aid of the Bloch equations.

3. The method of claim 1, wherein, to calculate the signal intensities setting values of at least one part of an imaging sequence used to record the raw data of the magnetic resonance image are used.

4. The method of claim 3, wherein repeating sections of the imaging sequence are taken into consideration at least partly repeatedly during the calculation.

5. The method of claim 4, wherein the calculation of the signal intensity is terminated if the difference between the signal intensities of two consecutive calculations does not reach a predetermined threshold value.

6. The method of claim 1, wherein, when calculating the signal intensities, a recording scheme, which specifies the recording sequence of the k-space lines, is taken into account.

7. A magnetic resonance device comprising:
   a control unit, configured to implement the method of claim 1;
   a simulation unit, configured to calculate signal intensities;
   a storage unit; and
   a classification unit, configured to classify an image property of a magnetic resonance image.

8. The method of claim 1, wherein, to calculate the signal intensities setting values, of at least one of HF pulses and magnetic field gradients, of at least one part of an imaging sequence used to record the raw data of the magnetic resonance image are used.

9. The magnetic resonance device of claim 7, wherein the signal intensities are calculated with the aid of the Bloch equations.

10. The magnetic resonance device of claim 7, wherein, to calculate the signal intensities the setting values of at least one part of the imaging sequence used to record the raw data of the magnetic resonance image are used.

11. The magnetic resonance device of claim 7, wherein, when calculating the signal intensities, the recording scheme, which specifies a recording sequence of the k-space lines, is taken into account.

12. The method of claim 1, wherein the classifying classifies the contrast behavior based on signal intensities of each imaged tissue and the contrast behavior of the magnetic resonance image is classified as the image property.

13. The method of claim 1, wherein the classifying includes,
   comparing a signal intensity of a first imaged tissue to a signal intensity of a second imaged tissue; and
   classifying the contrast behavior based on the comparison.

14. A method for the automated classification of an image property of a magnetic resonance image, the method comprising:
   determining at least the parameters and proton density of at least two tissues imaged in the magnetic resonance image or prespecifying at least two sets of at least the parameters;
   calculating signal intensity in a center of a k-space for each imaged tissue or each set of parameters; and
   classifying the image property as a function of the calculated signal intensities, wherein a contrast behavior of the magnetic resonance image is classified as the image property and the contrast behavior is classified into one of the classes T1 dominant, T2 dominant, T2* dominant, diffusion dominant, perfusion dominant, FMRI dominant, proton density dominant or FLAIR dominant, the classifying including,
   comparing signal intensities for cerebral spinal fluid, grey brain matter and white brain matter, and
   classifying the image property based on the comparing.

15. The method of claim 14, wherein the contrast behavior is classified into FLAIR dominant if
$$CSF < 0.1 * WM, \text{ and}$$
$$CSF < 0.1 * GM$$
where CSF is the signal intensity of the cerebral spinal fluid, WM is the signal intensity for the white brain matter and GM is the signal intensity for the grey brain matter.

16. The method of claim 15, wherein the contrast behavior is classified into T2 dominant if
   $CSF > GM$, and
   $CSF > WM$.

* * * * *